United States Patent [19]

Baba

[11] Patent Number: 5,565,379
[45] Date of Patent: Oct. 15, 1996

[54] METHOD OF MANUFACTURING A SEMICONDUCTOR DEVICE HAVING A BUMP ELECTRODE BY A PROXIMITY EXPOSURE METHOD

[75] Inventor: Shinji Baba, Hyogo, Japan

[73] Assignee: Mitsubishi Denki Kabushiki Kaisha, Tokyo, Japan

[21] Appl. No.: 386,407

[22] Filed: Feb. 10, 1995

Related U.S. Application Data

[62] Division of Ser. No. 188,983, Jan. 31, 1994, abandoned.

[30] Foreign Application Priority Data

Jan. 29, 1993 [JP] Japan ...................... 5-13061

[51] Int. Cl.⁶ .................................................. H01L 21/28
[52] U.S. Cl. ...................... 437/183; 437/173; 437/229; 430/313
[58] Field of Search .......................... 437/183, 173, 437/229; 257/737; 430/313, 314, 494

[56] References Cited

U.S. PATENT DOCUMENTS

| | | | |
|---|---|---|---|
| 4,258,382 | 3/1981 | Harris | 257/737 |
| 4,669,868 | 6/1987 | Chapelle et al. | 355/53 |
| 4,680,610 | 7/1987 | Pammer | 257/737 |
| 4,880,708 | 11/1989 | Sharma et al. | 437/192 |
| 4,907,029 | 3/1990 | Caprari | 355/67 |
| 4,912,545 | 3/1990 | Go | 257/737 |
| 4,927,505 | 5/1990 | Sharma et al. | 437/192 |
| 5,108,950 | 4/1992 | Wakabayashi et al. | 437/183 |
| 5,134,460 | 7/1992 | Brady et al. | 257/737 |
| 5,496,770 | 3/1996 | Park | 437/183 |

FOREIGN PATENT DOCUMENTS

| | | |
|---|---|---|
| 63-119551 | 5/1988 | Japan . |
| 63-272058 | 11/1988 | Japan . |
| 1-132139 | 5/1989 | Japan . |

OTHER PUBLICATIONS

S. Wolf, "Silicon Processing For the VLSF Era", vol. 2, Lattice Press, 1991, pp. 460–461, 468–473.

*Primary Examiner*—George Fourson
*Assistant Examiner*—Thomas G. Bilodeau
*Attorney, Agent, or Firm*—Lowe, Price, LeBlanc & Becker

[57] ABSTRACT

In a process for manufacturing a semiconductor device having a bump electrode, a pad electrode for external connection is formed on a semiconductor substrate, and then a insulating layer having a opening exposing a predetermined portion at an upper surface of the pad electrode is formed. A resist having a thickness in the range of 10 μm to 100 μm is formed on the insulating layer, and then the resist is selectively exposed to a light from which light components having wavelength of 340 nm or less are excluded. After the resist is developed and the resist positioned on the opening provided in the insulating layer are selectively removed, a bump electrode which is electrically connected to the pad electrode is formed using residual resist as a mask. By way of the manufacturing method, since light having the wavelength in the vicinity of 300 nm to which the resist is significantly sensitive does not reach the resist, a phenomenon of a rapid polymerization reaction on the upper portion of the resist of the exposed region can be prevented. As a result, verticality of the side face of the bump electrode with respect to the main surface of the semiconductor substrate is enhanced.

6 Claims, 10 Drawing Sheets

METHOD OF MANUFACTURING A SEMICONDUCTOR DEVICE HAVING A BUMP ELECTRODE BY A PROXIMITY EXPOSURE METHOD

This application is a division of U.S. patent application Ser. No. 08/188,983 filed Jan. 31, 1994, abandoned.

BACKGROUND OF THE INVENTION

1. Field of the Invention

The present invention relates generally to a semiconductor device having a bump electrode and manufacturing method thereof and, more particularly, to a semiconductor device having a bump electrode formed with high integration and high accuracy and a method enabling manufacturing of the same.

2. Description of the Background Art

A conventional semiconductor device having a bump electrode and a method of manufacturing the same will be described in the following with reference to FIGS. 10–22.

Figure 10:
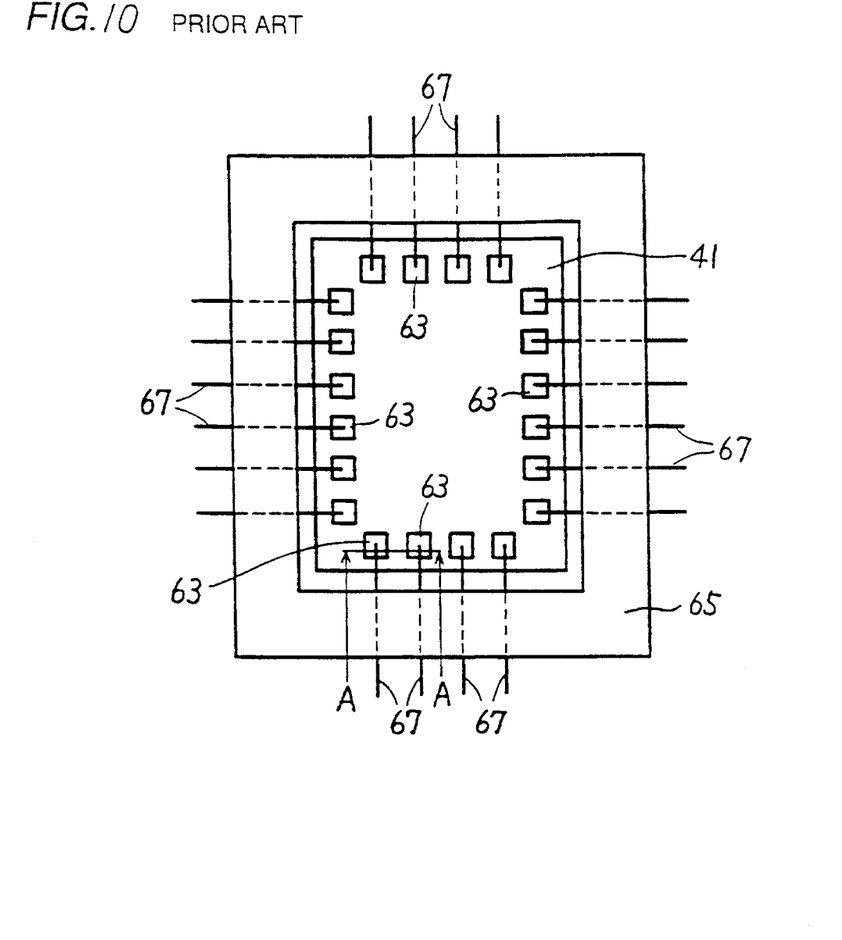
FIG. 10 is a plan view of a conventional interconnection layer having bump electrodes.

Referring to FIG. 10, a number of electronic elements (not shown) and a plurality of interconnection layers (not shown) are formed on a semiconductor substrate 41. An integrated circuit (not shown) is constituted by electrically connecting these electronic elements with interconnection layer. A plurality of bump electrodes 63 are formed on semiconductor substrate 41. Bump electrodes 63 are electrically connected to the integrated circuit formed on semiconductor substrate 41. A circuit board (not shown) and the integrated circuit formed on semiconductor substrate 41 are electrically connected through bump electrodes 63. Leads 67 in the form of a plate is supported by a film 65 on semiconductor substrate 41, one end of each lead 67 electrically connected to bump electrode 63.

Figure 11:
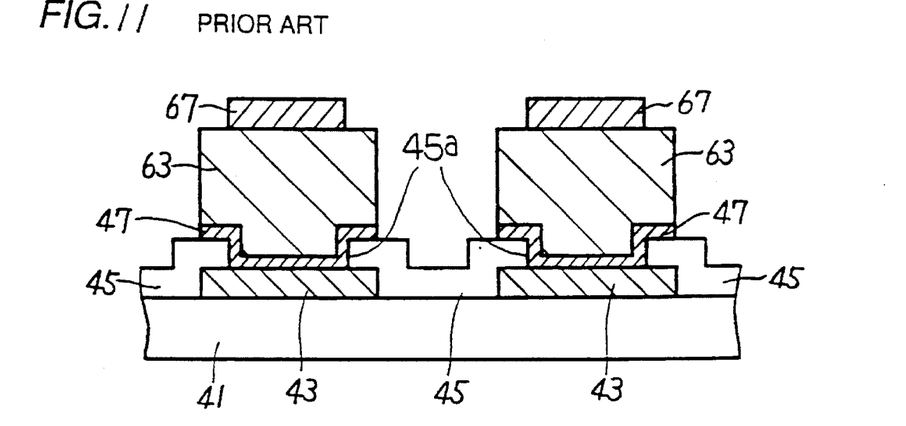
FIG. 11 is a cross sectional view taken along line A—A in FIG. 10.

Referring to FIG. 11, pad electrodes 43 are formed with a distance posed therebetween on semiconductor substrate 41. On semiconductor substrate 41, a insulating layer 45 is formed and a opening 45a exposing a part of a surface of pad electrode 43 is formed on insulating layer 45.

An under-bump layer 47 is formed on insulating layer 45. Under-bump layer 47 is electrically connected to pad electrode 43 through a opening 45a. A bump electrode 63 is formed on under-bump layer 47, and bump electrode 63 and under-bump layer 47 are electrically connected. Lead 67 which is electrically connected to bump electrode 63 is formed on bump electrode 63.

There is a method of directly bonding wires made of gold, aluminum or the like to pad electrode 43 without using under-bump layer 47 and bump electrode 63. However, this method has the following defects. When it is necessary to form a number of pad electrodes 43 on semiconductor substrate 41, the distance between two of pad electrodes 43 becomes short. When the distance between pad electrodes 43 is short and the wire is bonded deviated from a desired pattern, the wire may be short circuited with an adjacent wire. Therefore, when the distance between two pad electrodes 43 is short, a structure having lead 67 in the form of a plate bonded to pad electrode 43 should be used. However, it is difficult to directly bond lead 67 to pad electrode 43 because pad electrode 43 is positioned in a recess. Therefore, bump electrode 63 which is electrically connected to pad electrode 43 is formed, and on bump electrode 63, lead 67 in the form of a plate is bonded.

A method of manufacturing a semiconductor device having a structure shown in FIG. 11 will be described.

Figure 12:
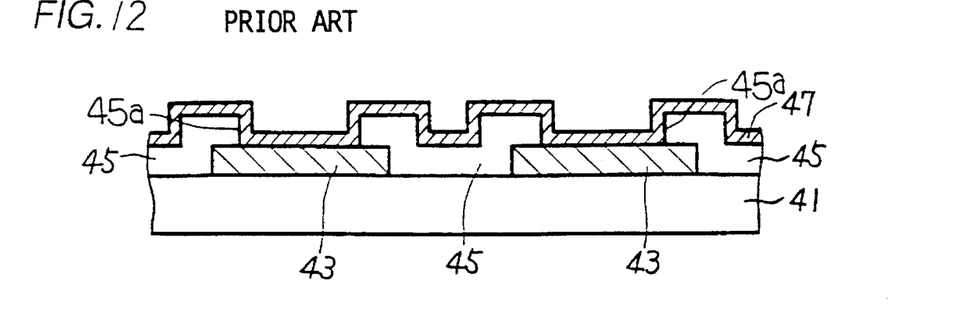
FIGS. 12 through 18 are cross sectional views showing a method of manufacturing a conventional bump electrode.

As shown in FIG. 12, pad electrode 43 formed of AlCu alloy or the like, for example, is formed on semiconductor substrate 41. Pad electrode 43 is electrically connected to an integrated circuit (not shown) which is formed on semiconductor substrate 41. A insulating layer 45 of SiN, for example, is formed to cover pad electrode 43 on semiconductor substrate 41 by using CVD (Chemical Vapor Deposition) method, for example. A opening 45a exposing pad electrode 43 is formed in insulating layer 45 using photolithography and etching technology.

An under-bump layer 47 is formed on insulating layer 45 using sputtering, for example. Under-bump layer 47 has a two-layer structure, the lower layer of which is of Ti-W and the upper layer of which is of Au, for example. Under-bump layer 47 is electrically connected to pad electrode 43 through opening 45a.

Figure 13:
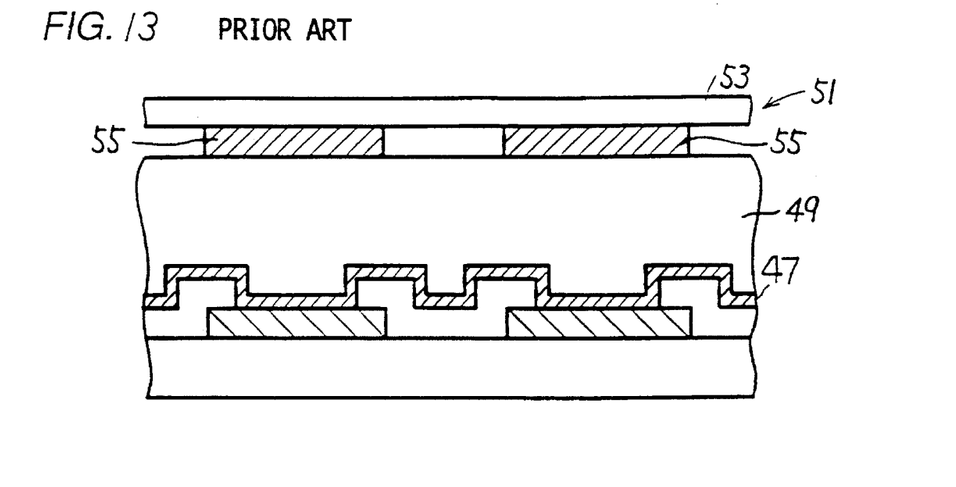

As shown in FIG. 13, a photoresist 49 of 20–40 μm in thickness is formed on under-bump layer 47 by spin coating a resist solution (BMR S-1000 manufactured by Tokyo Ohka Kogyo Co. Ltd., for example) of the viscosity of several hundreds to one thousand and several hundreds CPS at the rotation rate of several hundreds rpm. Then a mask 51 is aligned on photoresist 49. Mask 51 is made by forming a mask pattern 55 on a glass substrate 53. Mask 51 is in close contact tight with photoresist 49.

Figure 14:
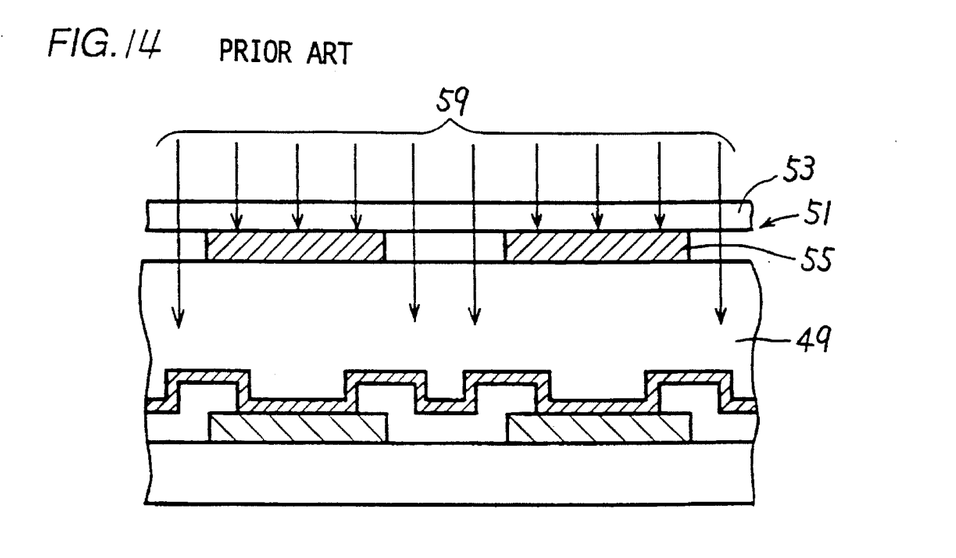

As shown in FIG. 14, by irradiating photoresist 49 with a light 59 through mask 51, photoresist 49 is selectively exposed. Light 59 does not reach a portion of photoresist 49 which is positioned just under mask pattern 55.

Figure 15:
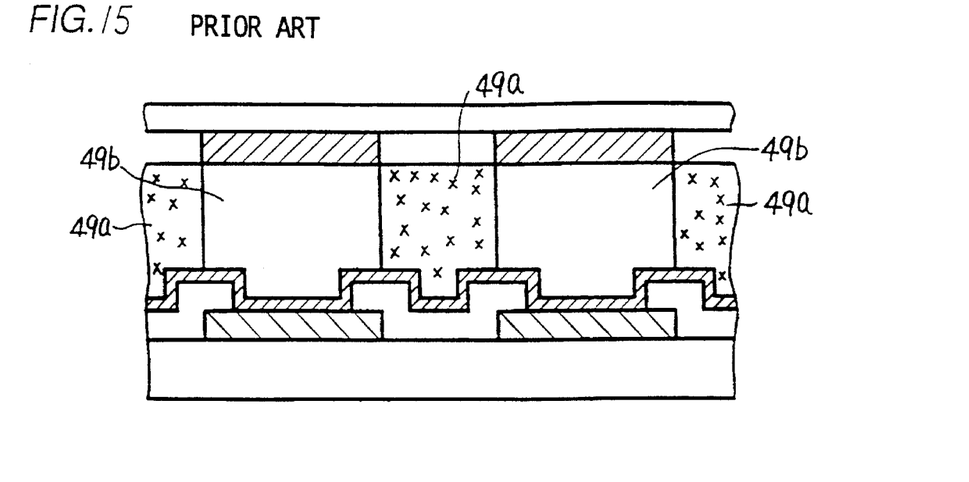

As shown in FIG. 15, a portion irradiated with light 59 is indicated by 49a and a portion which is not irradiated is indicated by 49b in photoresist 49. Molecular polymerization reaction in the photoresist (shown as X in the figures) occurs in a portion 49a which is irradiated with light 59.

Figure 16:
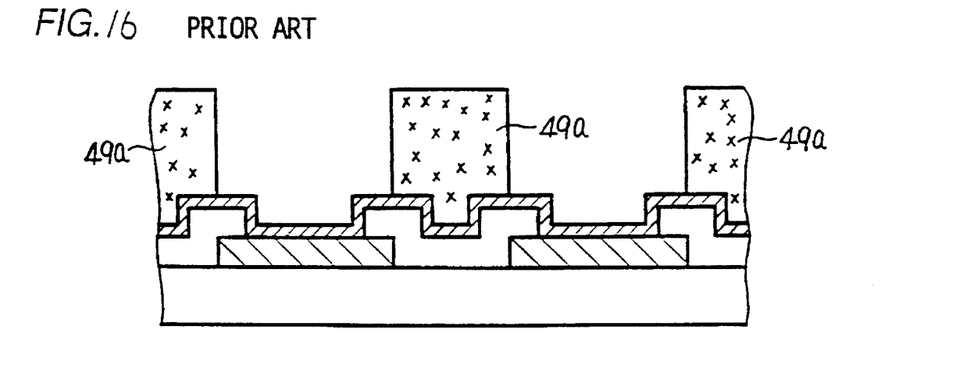

FIG. 16 shows a state after a developing process of photoresist 49 is carried out. In photoresist 49, a portion 49a which is irradiated with light is left undissolved in a developer.

Figure 17:
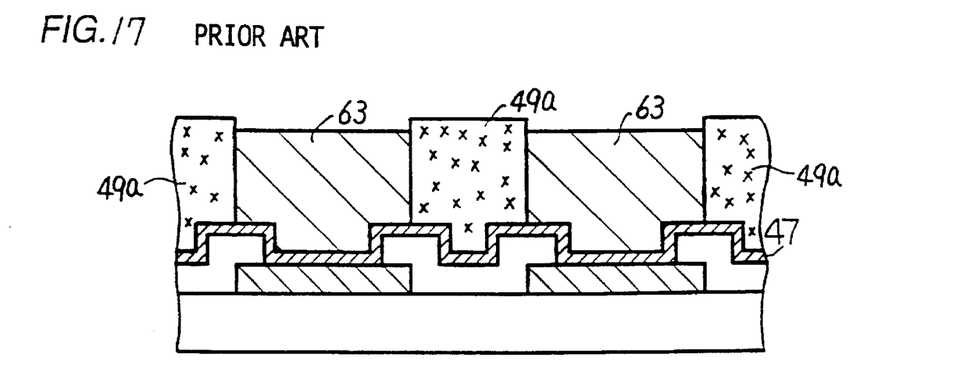

As shown in FIG. 17, a bump electrode 63 is formed using photoresist 49a as a mask by gold plating method using under-bump layer 47 as an electrode.

Figure 18:
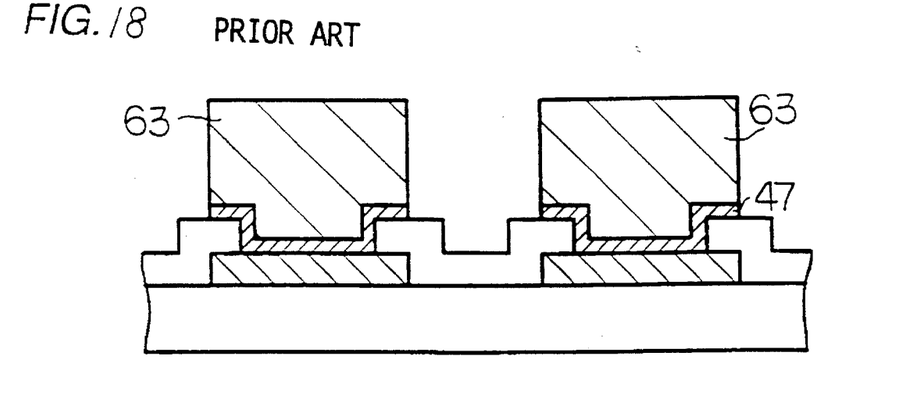

As shown in FIG. 18, photoresist 49a is removed. Then, under-bump layer 47 is selectively removed using bump electrode 63 as a mask.

By bonding lead 67 on bump electrode 63, manufacturing process of the structure shown in FIG. 11 is completed.

Method of exposing a photoresist includes contact exposing method, proximity exposing method and the like. In the contact exposing method, exposure is effected with a mask in close contact with a photoresist. When the contact between the mask and the photoresist is perfect, an exposure of pattern with a high resolution can be attained with small bad influence caused by diffraction of light. A pattern with a high resolution is, in other words, a fine-pitch pattern. In contact exposing method, using adhesion preventing solution is required for preventing a mask from adhering to the photoresist.

In the proximity exposing method, exposure is carried out with a gap of several tens μm to several hundreds μm between the mask and the photoresist. By this method, the defects of contact exposing method can be eliminated. However, the resolution is lower than that of contact exposing method because of the bad influence such as diffraction of light phenomenon.

The resolution of photoresist 49 (see FIG. 13) which is conventionally used in forming a bump electrode is, provided that the thickness thereof is 30 μm, about 10 μm when the contact exposing method is used and about 50 μm when the proximity exposing method is used. As shown in FIG. 13, the contact exposing method is conventionally used, therefore such resolution is sufficient. However, it is desired to use proximity exposing method to avoid the above-mentioned defects of the contact exposing method and to obtain a resolution of 30 μm or less when the thickness of the photoresist is about 30 μm.

Figure 19:
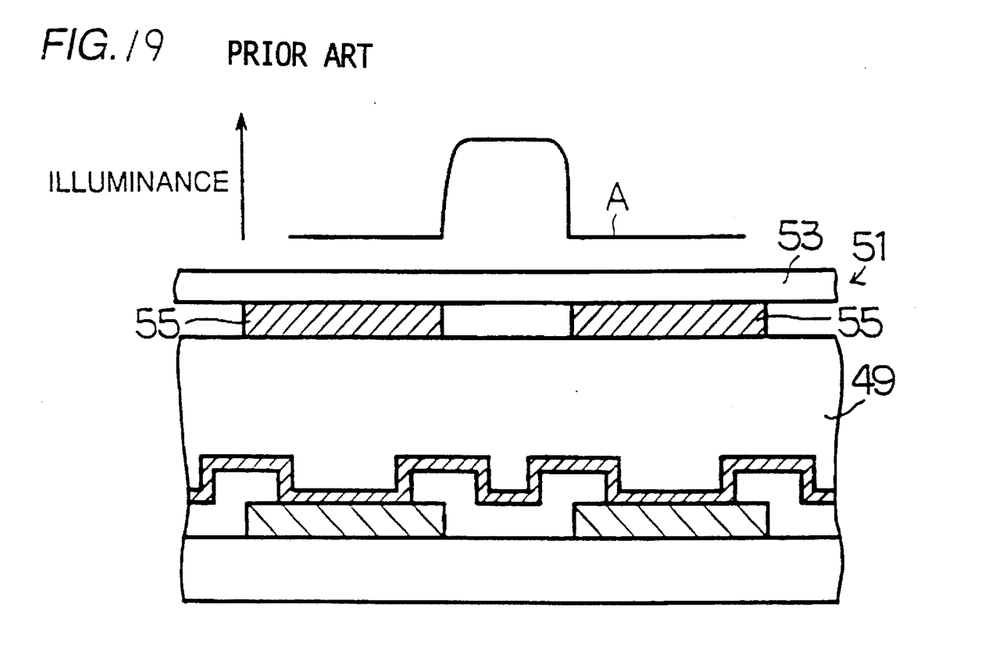
FIG. 19 is a diagram showing illuminance of light passing between mask patterns 55 in exposure.
Figure 20:
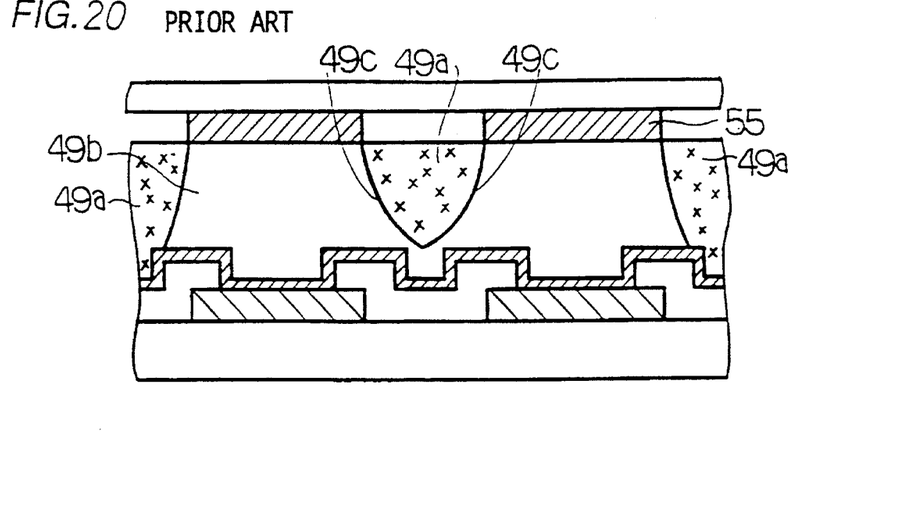
FIG. 20 is a cross sectional view showing the distance between the side faces 49c, 49c of photoresist 49a largely reduced as it goes lower after exposure.

A in FIG. 19 shows an illuminance of light passing between mask patterns 55. Illuminance of the light near the edges of mask patterns 55 is low. Therefore, lower portion of photoresist 49 just under the vicinity of the edges of mask patterns 55 is not sufficiently irradiated with light. Therefore, in fact, the configuration of 49a, which is a portion of photoresist 49 irradiated with light, is as shown in FIG. 20. That is, the lower, the smaller the distance between right and left side faces 49c, 49c of photoresist 49a.

Figure 21:
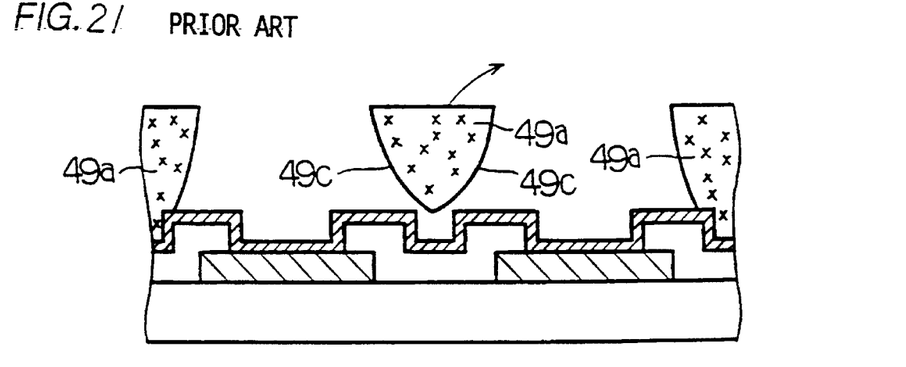
FIG. 21 is a cross sectional view showing the state when the photoresist shown in FIG. 20 is developed.

When the distance between right and left side faces 49c, 49c much reduces at the lower portion, right and left side faces 49c, 49c are connected and when development is carried out, photoresist 49a, which is to be left, is removed as shown in FIG. 21. Therefore, when such photoresist 49a is used as a mask to form a bump electrode, two adjacent bump electrodes are formed connected to each other.

Figure 22:
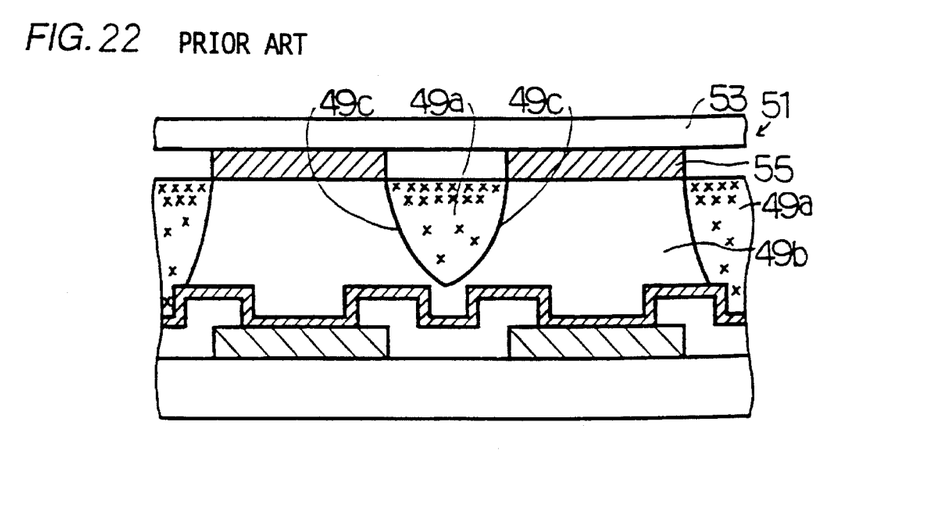
FIG. 22 is a cross sectional view showing a state when exposure is carried out using a photoresist with a high sensitivity.

When the sensitivity of photoresist 49 is increased, molecular polymerization reaction occurs in photoresist 49 even though illuminance is not enough. Therefore, it may be that the distance between side faces 49c, 49c is not much decreased if a high sensitivity of photoresist 49 is attained. However, in fact, the distance between side faces 49c, 49c becomes narrower as it goes lower as shown in FIG. 22 even though the high sensitivity of photoresist 49 is attained. The reason is that polymerization reaction proceeds rapidly at the upper portion of photoresist 49 and light hardly reaches the lower portion of photoresist 49 when a high sensitivity of photoresist 49 is attained.

SUMMARY OF THE INVENTION

One object of the invention is to provide a method of manufacturing a semiconductor device in which bump electrodes with a high integration can be accurately formed.

The method of manufacturing the semiconductor device of the present invention to attain the above object includes the following steps.

At first, a pad electrode for external connection is formed on a semiconductor substrate, and thereafter a insulating layer having a opening exposing a predetermined portion of the upper face of the pad electrode is formed. On the insulating layer, a resist having a thickness of 10 μm–100 μm is formed, and then the resist is selectively exposed by way of light, of which light components corresponding to the wavelength of 340 nm or the less are removed. After the resist is developed and the resist positioned on the opening provided in the insulating layer is selectively removed, a bump electrode in which a pad electrode is electrically connected is formed using the residual resist as a mask.

According to the manufacturing method, when resist is selectively exposed to the light from which light components corresponding to the wavelength of 340 nm or less are excluded, light, which has a wavelength of about 300 nm to which the resist is very sensitive, does not reach the resist. Therefore, occurrence of a rapid polymerization reaction at the upper portion of the resist of the exposed region is prevented and the lower portion of the resist is irradiated sufficiently with light. As a result, the conventional problem, that is, the lower portion of the resist being smaller than the width of the upper portion after development can be solved, and a semiconductor device having a bump electrode with side faces of high verticality with respect to the surface of the semiconductor substrate can be manufactured.

In a preferred embodiment of a method of manufacturing a semiconductor device having a bump electrode of the present invention, the step of forming a resist includes the step of forming a resist with a resolution aspect ratio of 1 or more on a insulating layer when proximity exposing method is used. By forming a resist with such aspect ratio, a pattern having so narrow distance between pad electrodes as to make wire bonding with wires almost impossible can be formed by using proximity exposing method. As a result, adhesion preventing solution, which is a defect in contact exposing method, becomes unnecessary, and efficiency of exposing process can be enhanced.

In the step of forming a resist on a insulating layer, it is preferable to form a photoresist having a thickness of 20–40 μm. This step of selectively exposing the resist is carried out by positioning photomasks apart from the surface of the resist with a gap of 10–100 μm.

Light components having a wavelength of 340 nm or less can be eliminated from the light selectively exposing the resist by disposing a filter which does not transmit light having a wavelength of 340 nm or less between a lens and a mirror disposed between light source and a photomask, for example.

Such filter can be positioned between a photomask and a lens provided between the light source and a photomask.

Alternatively, a lens formed of a material which hardly transmits light components having the wavelength of 340 nm or less such as a soda glass may be provided between a light source and a photomask, as a lens provided between the light source and the photomask in place of the filter, to attain the object. By the manufacturing method of the present invention described above, a semiconductor device having a bump electrode with a deviation between the upper and lower ends of the side face with respect to the direction in parallel with a main surface of the semiconductor substrate being 2 μm or less can be formed. Owning to the bump electrode having such structure, a bump electrode can be formed accurately on a pad electrode so highly integrated that wire bonding is almost impossible, and an undesirable phenomenon such as two adjacent bump electrodes connected to each other causing short circuit can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring to FIGS. 1 through 9, one embodiment of the present invention will be described.

Figure 6:
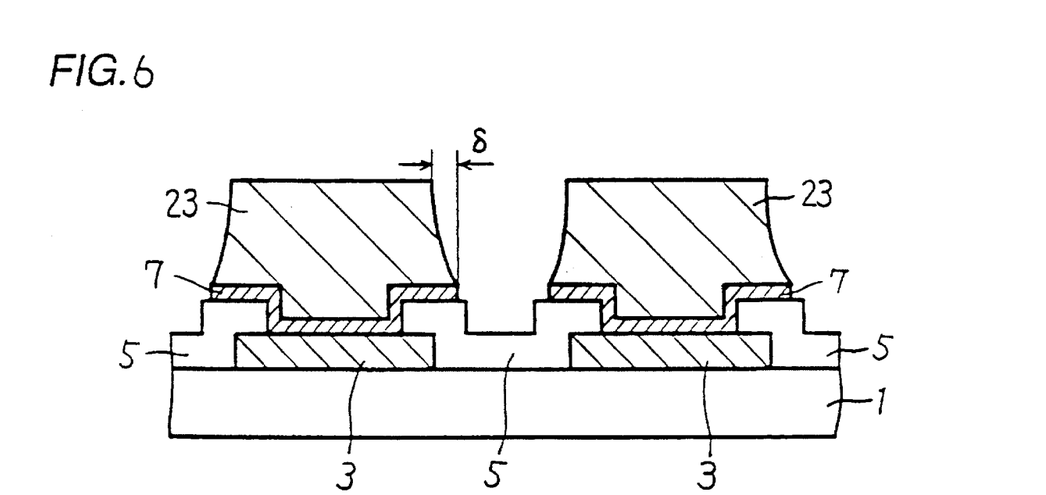

In a bump electrode of the present embodiment as shown in FIG. 6, pad electrodes 3 are formed spaced on a semiconductor substrate 1. A insulating layer 5 is formed on semiconductor substrate 1. A opening 5a is formed on the insulating layer 5 for exposing a portion of the surface of pad electrode 3. An under-bump layer 7 is formed on insulating layer 5. Under-bump layer 7 is electrically connected to pad electrode 3 through opening 5a.

The bump electrode of the present embodiment is manufactured according to the following steps.

Figure 1:
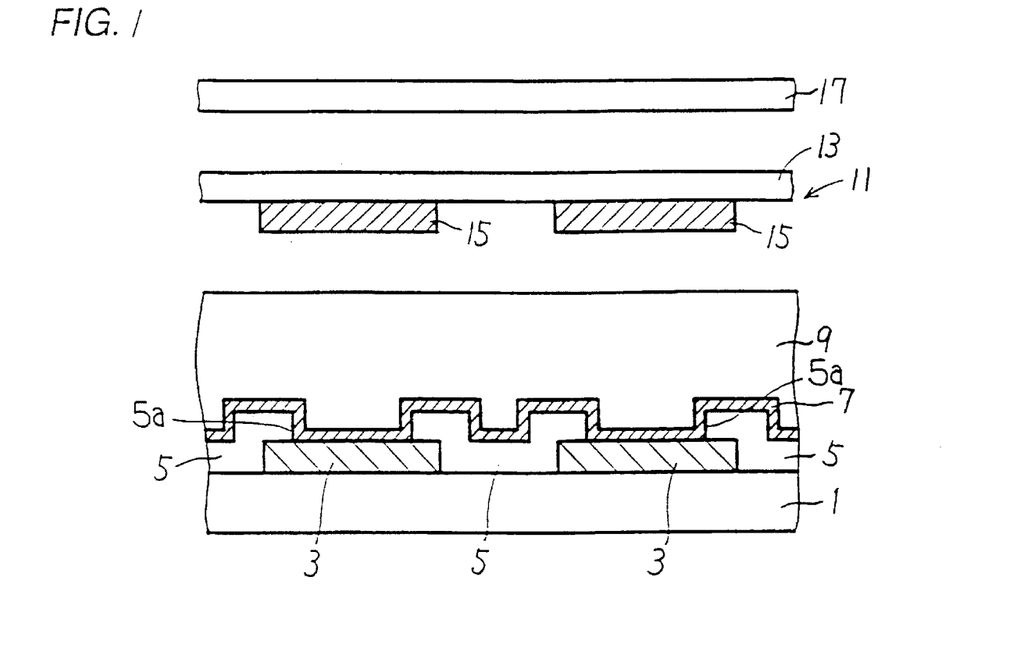
FIGS. 1 through 6 are cross sectional views showing a method of manufacturing a semiconductor device according to one embodiment of the present invention.

Referring to FIG. 1, a pad electrode 3 of AlCu alloy, for example, is formed on a semiconductor substrate 1. Pad electrodes 3 are electrically connected to an integrated circuit (not shown) formed on semiconductor substrate 1. An insulating layer 5 of SiN, for example, is formed to cover pad electrode 3 on semiconductor substrate 1 by using CVD method, for example. Using photolithography and etching technology, a opening 5a is formed in insulating layer 5 for exposing pad electrode 3.

An under-bump layer 7 is formed on insulating layer 5 by sputtering, for example. Under-bump layer 7 has a two-layer-structure in which the lower layer is Ti-W and the upper layer is Au, for example. Under-bump layer 7 is electrically connected to pad electrode 3 through opening 5a.

Then a photoresist 9 of 20–40 μm in thickness is formed on under-bump layer 7 by spin coating with a resist solution (e.g. BMR C-1000 manufactured by Tokyo Ohka Kogyo Co., Ltd. for example) of the viscosity of several hundreds to one thousand and several hundreds CPS at the rotation rate of several hundreds rpm. The resolution of photoresist 9 with a thickness of 30 μm is about 10 μm when a contact exposing method is used and about 20 μm when proximity exposing method is used.

A mask 11 is aligned apart from the photoresist 9 with a gap of about 10 μm to about 100 μm. Proximity exposing method is used in this embodiment. The reason is to enhance the efficiency of the exposure process by avoiding the defects of contact exposing method such as the necessity of using adhesion preventing solution. Mask 11 is made by forming a mask pattern 15 on a glass substrate 13. A filter 17 is disposed on mask 11. Filter 17 does not transmit light components having the wavelength of 340 nm or less.

Figure 2:
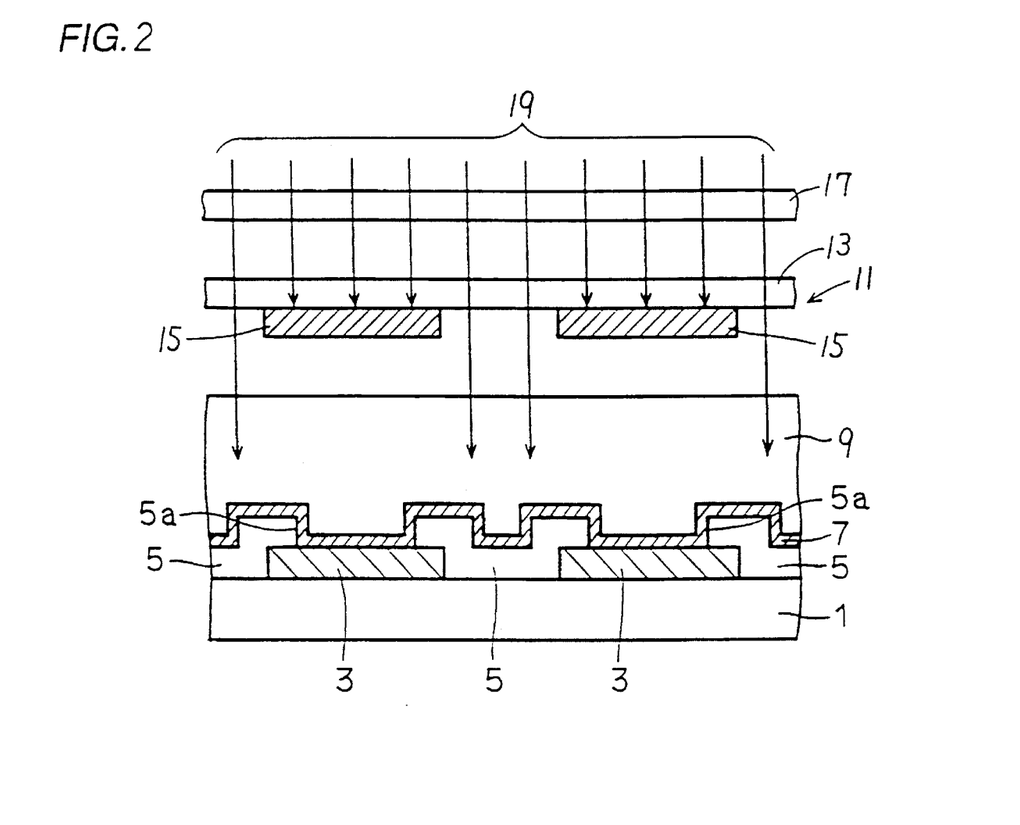

As shown in FIG. 2, photoresist 9 is irradiated with light 19 through filter 17 and mask 11, and selectively exposed. Light 19 does not reach that portion of the photoresist 9 which is positioned just under the mask pattern 15. Since filter 17 removes light components having wavelength of 340 nm or less, light having the wavelength of 340 nm or less does not reach photoresist 9 in exposure.

Figure 3:
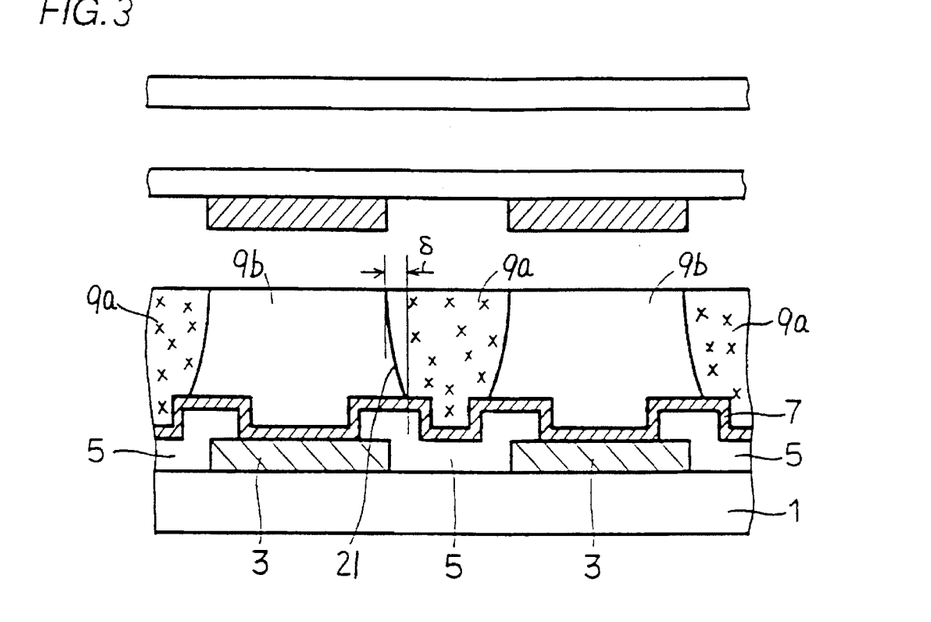

FIG. 3 shows the state of resist 9 after exposure. A portion irradiated with light 19 is indicated as 9a while a portion which is not irradiated is indicated by 9b in photoresist 9. Polymerization reaction of molecular in the photoresist occurs at portion 9a irradiated with light 19, which is indicated by x marks in the figure. A side face of photoresist 9a is indicated by 21. The length δ shown in FIG. 3, that is, the deviation between the upper and lower ends of side face 21 in the direction parallel to the main surface of the semiconductor substrate 1 can be 2 μm or less.

Figure 4:
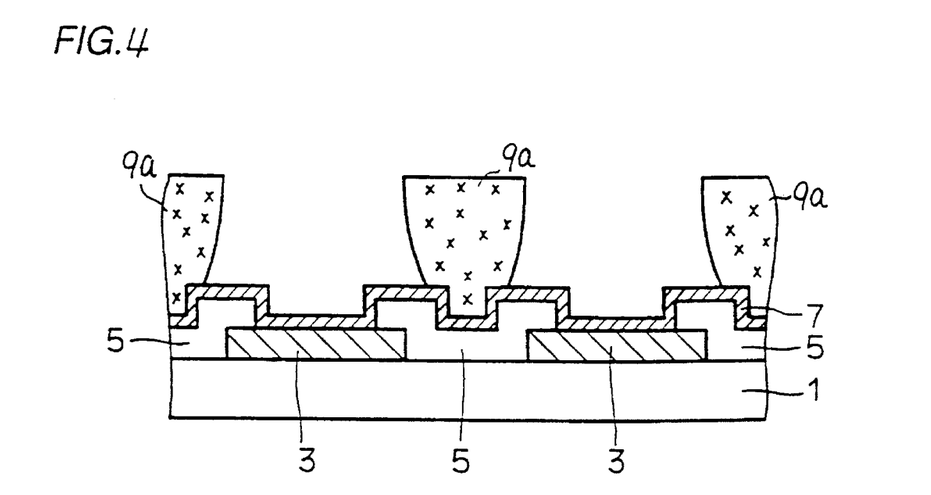

FIG. 4 shows a state after photoresist 9 is dipped into a developer. A portion 9a of photoresist 9 which is irradiated with light is left undissolved in the developer.

Figure 5:
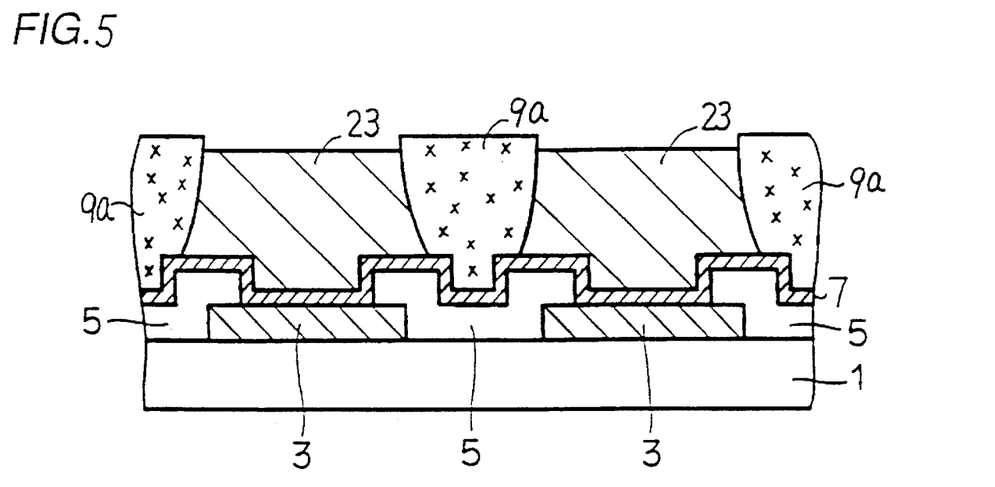

As shown in FIG. 5, bump electrodes 23 are formed using photoresist 9a as a mask by gold plating method using under-bump layer 7 as an electrode.

As shown in FIG. 6, photoresist 9a is removed. Then, under-bump layer 7 is selectively removed using bump electrodes 23 as a mask. Thus, a process for forming bump electrodes 23 of the present embodiment is completed. After the formation of bump electrodes 23, a semiconductor device having the same planar structure as that shown in FIG. 10 is completed by bonding a lead in the form of a plate on the upper face of bump electrodes 23 in the same manner as that in the conventional art as shown in FIGS. 10 and 11.

Figure 7:
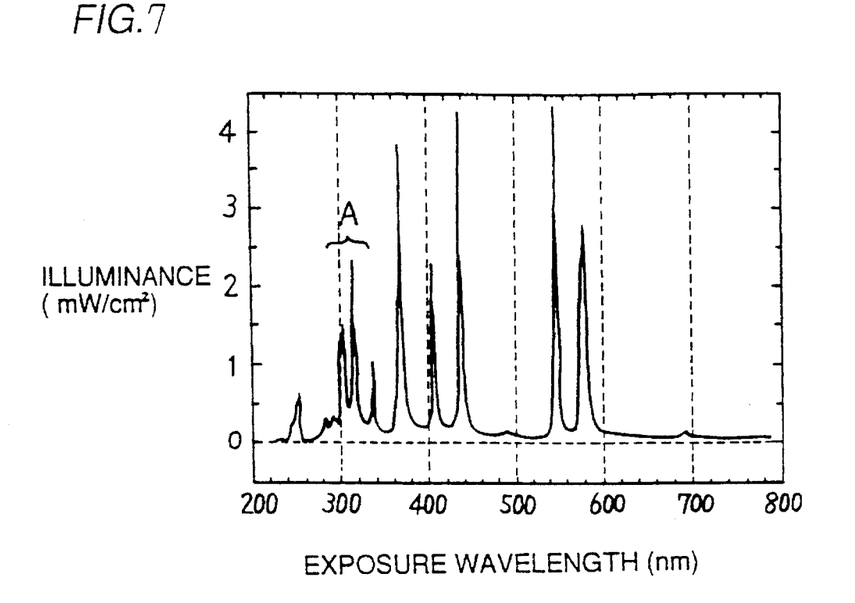
FIG. 7 is a graph showing the relation between illuminance and exposure wavelength of mercury-vapor lamp used in one embodiment of the present invention.

In the present embodiment, a mercury-vapor lamp is used as a light source of light 19 shown in FIG. 2. FIG. 7 is a graph showing the relation between illuminance and exposure wavelength of the mercury-vapor lamp used in the present embodiment. The photoresist is significantly sensitive to the lights in the vicinity of 300 nm which is indicated as A in FIG. 7. Accordingly, light components having the wavelength of 340 nm or less are removed by filter 17. Thus, even though the sensitivity of the photoresist is high, a rapid polymerization reaction at the upper portion of the photoresist can be prevented and the lower portion of the photoresist can be sufficiently irradiated with light. Therefore the deviation δ between the upper and lower ends of side face 21 in the direction of the plane parallel to the main surface of semiconductor substrate 1 shown in FIGS. 3 and 6 can be reduced to 2 μm or less.

Figure 8:
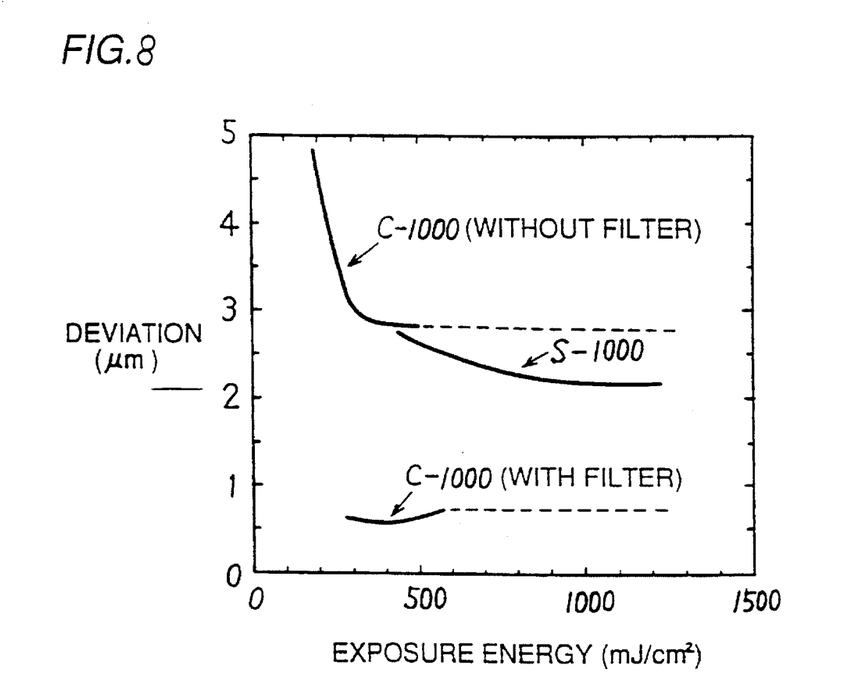
FIG. 8 is a graph showing the relation between the exposure energy and deviation of the upper and lower ends of a side face of the photoresist in the direction parallel to the surface of the semiconductor substrate.

FIG. 8 is a graph showing the relation between the exposure energy and verticality of the sidewall of the photoresist with respect to the main surface of the semiconductor substrate. In FIG. 8, a graph indicated as C-1000 (with a filter) shows a result of the present embodiment. More specifically, it represents the result when exposure is carried out with a light of which light components having wavelength of 340 nm or less are removed by using proximity exposing method by a high sensitivity photoresist. In FIG. 8, a graph indicated as S-1000 shows a result when the conventional process is used. More specifically, it represents the result when low sensitivity photoresist is used and exposure is carried out by contact exposing method, with light, of which light components having wavelength of 340 nm or less are not excluded. In FIG. 8, a graph indicated as C-1000 (without a filter) shows a comparison example. That is, it shows a result when exposure is carried out in accordance with the proximity exposing method using a high sensitivity photoresist and light of which light components having the wavelength of 340 nm or less are not removed. As is obvious from the graph shown in FIG. 8, the deviation δ between the upper and lower ends of the side face of bump electrode 23 in the direction of the main surface of semiconductor substrate 1 can be reduced to 2 μm or less by the present embodiment. Therefore, by forming a bump electrode using the photoresist as a mask, verticality of the bump electrode with respect to the main surface of the semiconductor substrate can be enhanced.

Figure 9:
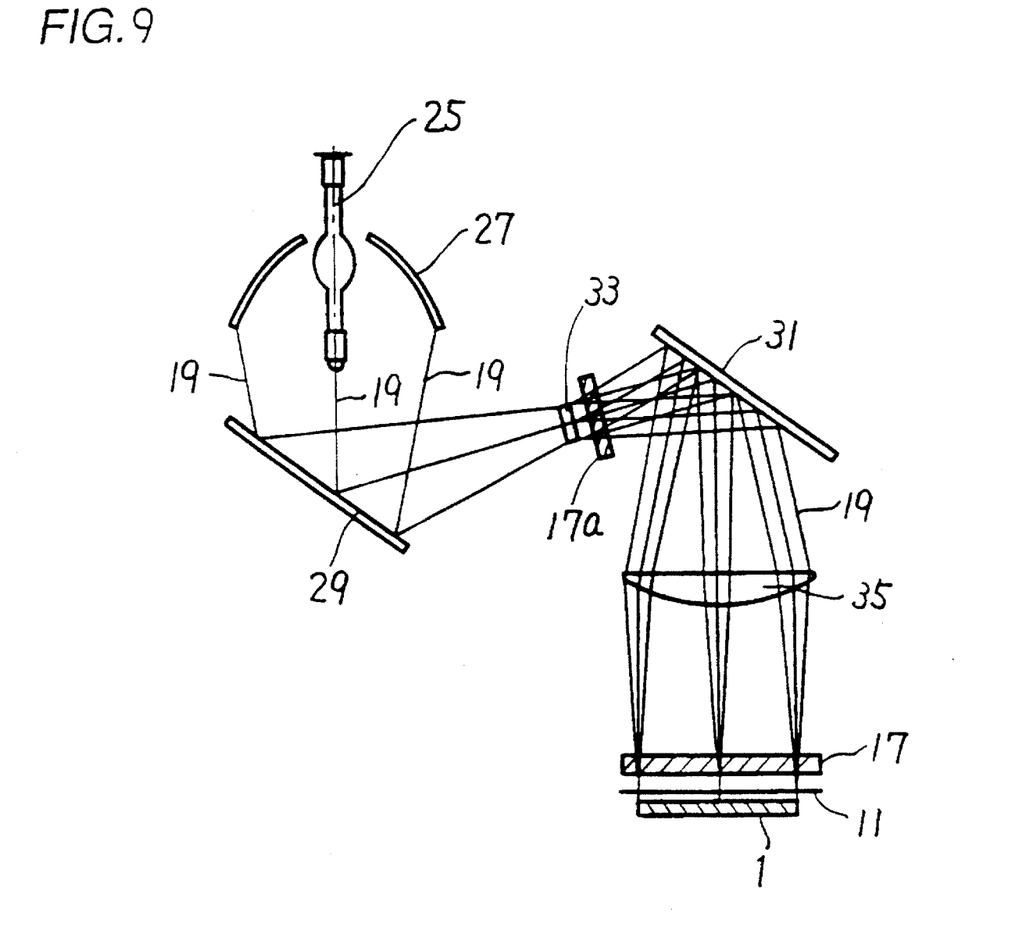
FIG. 9 is a diagram schematically showing an exposing apparatus used in one embodiment of the present invention.

The exposing apparatus used in the present invention has a structure schematically shown in FIG. 9. Referring to FIG. 9, there are two cases where light 19 irradiated from the mercury-vapor lamp 25 directly reaches mirror 29 and where it reaches mirror 29 reflected by mirror 27. Light 19 reflected from mirror 29 passes through lens 33 to mirror 31. Light 19 comes to have a uniform illuminance distribution as it passes through lens 33.

Light 19 reflected from mirror 31 passes through lens 35 and irradiates semiconductor substrate 1 through filter 17 and mask 11. A light passing through lens 35 is changed into a parallel light beams.

In this embodiment, although filter 17 is provided in the vicinity of mask 11, the same object can be attained by providing a filter between lens 33 and mirror 31 as indicated by 17a in FIG. 9.

Alternatively, by using a material (e.g. soda glass) which has a poor transmitivity with respect to the light components having the wavelength of 340 nm or less as a material for lens 33 or lens 35 instead of filter 17, removal of the light components having the wavelength of 340 nm or less from the exposure light can be attained.

In this embodiment, although proximity exposing method is used as an exposing method, contact exposing method or projection exposing method can be used alternatively. Additionally, although in the present embodiment bump electrodes are formed using gold plating method it can also be formed by using vapor deposition method. Furthermore, in the present embodiment, although the thickness of photoresist 9 is about 20 μm to about 40 μm, photoresist 9 having the thickness in the range of 10–100 μm is also applicable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having a bump electrode, comprising the steps of:

forming a pad electrode for external connection on a semiconductor substrate;

forming an insulating layer having an opening exposing a portion at an upper surface of said pad electrode on said semiconductor substrate;

forming a resist having a thickness of about 10 to about 100 μm over said insulating layer;

selectively exposing said resist by a proximity method to a light from which light components having a wavelength of 340 nm or less are removed, wherein the resist has a resolution equal to or less than the thickness of the resist during selective exposure;

developing said resist and selectively removing said resist positioned on said opening and leaving residual resist; and forming a bump electrode which is electrically connected to said pad electrode using said residual resist as a mask.

2. The method of manufacturing the semiconductor device having the bump electrode in accordance with claim 1, wherein the step of forming said resist on said insulating layer includes the step of forming a photoresist having a thickness of 20–40 μm; and the step of selectively exposing said resist is carried out by disposing a photomask spaced apart from the surface of said resist with a gap of 10–100 μm therebetween.

3. The method of manufacturing the semiconductor device having the bump electrode in accordance with claim 1, wherein said step of selectively exposing said resist is carried out with a mirror and a lens optically interposed between a light source and photomask and with a filter which does not transmit light having a wavelength of 340 nm or less interposed between said mirror and said lens.

4. The method of manufacturing the semiconductor device having the bump electrode in accordance with claim 1, wherein said step of selectively exposing said resist is carried out with a lens optically interposed between a light source and said photomask and a filter which does not transmit light components having a wavelength of 340 nm or less optically interposed between said photomask and said lens.

5. The method of manufacturing the semiconductor device having the bump electrode in accordance with claim 1, wherein said step of selectively exposing said resist is carried out with a lens formed of a material which has substantially no transmittance to light having a wavelength of 340 nm or less interposed between a light source and a photomask.

6. The method of manufacturing the semiconductor device having the bump electrode in accordance with claim 5, wherein a lens of soda glass is used as said lens.

* * * * *